Feb. 25, 1964 J. KRYNOCK 3,122,464

METHOD OF FABRICATING SEMICONDUCTOR DEVICES

Filed Jan. 10, 1961

INVENTOR.
John Krynock
BY
W.S. Hill
AGENT 3,122,464

METHOD OF FABRICATING SEMICONDUCTOR DEVICES

John Krynock, Somerville, N.J., assignor to Radio Corporation of America, a corporation of Delaware Filed Jan. 10, 1961, Ser. No. 81,892
7 Claims. (Cl. 156—17)

This invention relates to improved semiconductor devices and methods of fabricating them. More particularly, the invention relates to improved methods of treating semiconductive germanium wafers to form junction type semiconductor devices.

The type of rectifying barrier known as a P–N junction is generally introduced into a semiconductive wafer by either surface alloying or diffusion techniques. In the surface alloy process, a pellet of electrode material is positioned on the surface of a semiconductive wafer. The pellet consists of or includes a material which is capable of modifying the conductivity type of the particular semiconductor utilized. Such a material is known as an impurity material, and is designated as an acceptor if it induces P-type conductivity, and a donor if it induces N-type conductivity. The assemblage of wafer and pellet is heated to a temperature above the melting point of the electrode pellet but below the melting point of the wafer. The electrode pellet melts during this step and the molten pellet dissolves a portion of the semiconductor wafer material. On cooling, the dissolved semiconductor wafer material is precipitated from the melt and recrystallizes on the original wafer lattice. The recrystallized semiconductor material contains a sufficient concentration of the conductivity type modifying material to alter its conductivity type. A rectifying barrier is thereby formed between the recrystallized region and the original bulk of the wafer.

In the diffusion process, the semiconductor wafer is heated in an environment containing the conductivity type-determining material. The type-determining material thereby diffuses into the surface of the wafer.

Some semiconductor devices, for example triode transistors, contain more than one P-N junction, and some junction devices utilize both diffusion and alloying techniques. In the type of device known as a drift field transistor, the diffusion process is utilized to form the graded conductivity base region, while the emitter and collector junctions may be fabricated by the surface alloy method. See for example "Design, Construction, and High-Frequency Performance of Drift Transistors," by A. L. Kestenbaum and N. H. Ditrick, RCA Review, March 1957.

When a rectifying P-N junction is introduced into a germanium wafer by either the surface alloy method or the diffusion process, it has been found that the surface of the wafer is adversely affected. It has also been found that some of the acceptor or donor impurity material excessively diffuses along the surface of the semiconductor wafer, thereby creating low-resistance wafer surface regions which bridge and substantially short-circuit the portions of the rectifying junction that are exposed at the surface of the semiconductor wafer. These low-resistance surface regions are known as leakage paths, and tend to degrade the electrical parameters of the device. For example, the breakdown voltage is decreased, since some current leaks along these low resistance paths across the surface intercept of each junction in the reverse direction. The leakage currents increase as the length of the junction surface intercept, known as the leakage path, increases. The magnitude of the leakage current also depends inter alia on the recombination velocity of electrons and holes on the surface of the transistor, the lifetime of charge carriers in the bulk of the transistor, and the total resistivity of the P and N regions.

The total saturation current or minority carrier flow across a reverse-biased junction is the sum of the hole current from the N region to the P region, and the electron current from the P region to the N region. The total reverse current across a reverse-biased PN junction, for example the reverse current across the collector junction of a conventional junction transistor, is thus the sum of the saturation current and the leakage current. At ordinary temperatures, the thermal energy of the semiconductive body of the transistor is sufficient to disrupt some of the electron-hole pairs present, so that some charge carriers are always available to flow across the collector junction in the reverse direction. As this minority charge carrier flow or saturation current is a thermal energy effect, it varies as the temperature of the semiconductive body. In a practical junction transistor, for example a PNP triode device, the leakage current is the more important component of the reverse current, since the leakage current is larger than the saturation current.

The reverse current of a transistor is generally defined as the current which flows across the collector junction in the reverse direction when the emitter current is zero. Since the input signal is usually applied to the emitter, the transistor reverse current constitutes that portion of the output current which is not controlled by the signal input. It is therefore desirable to minimize the reverse current across the collector junction in order to increase the response sensitivity of the transistor to an applied signal.

In order to improve the characteristics of completed semiconductor junction devices, it has been found desirable to treat the alloyed or diffused semiconductor wafers with a relatively mild etchant just prior to the encapsulation of the completed device. For junction devices in which the semi-conductor wafer consists of germanium, it has been found that a hydrogen peroxide solution having a concentration of about 15 percent may be utilized as the etchant. This etchant solution removes some of the germanium wafer around each junction, hence also removes the excess impurity material which tends to smear the junction, and thus clearly defines the high resistance junction barrier.

Although hydrogen peroxide solutions have been successfully utilized to minimize surface leakage paths on germanium wafers, an etchant which is improved in several respects is desirable. First, hydrogen peroxide solutions are not stable, and improved stability of the etchant solution is desirable in order to obtain a more uniform product. Moreover, concentrated hydrogen peroxide solutions are relatively expensive, and cost reduction is desirable for mass production.

Accordingly, an object of this invention is to provide an improved method of fabricating improved semiconductor devices.

Another object of the invention is to provide an improved method of etching PN junction devices.

Still another object is to provide an improved method of minimizing the surface leakage paths on the semiconductor wafer of a PN junction device.

Yet another object is to provide improved transistors having improved breakdown voltage.

A further object is to provide improved transistors having increased response sensitivity to an applied signal.

But another object is to provide improved transistors having decreased reverse current across the collector junction.

These and other objects of the invention are accomplished by a method of treating the surface of a semiconductor germanium wafer by contacting the wafer with an aqueous solution of sodium pyrophosphate peroxide. In the fabrication of semiconductive germanium devices which include at least one PN junction, it has been found that etching the germanium body before encapsulation with an aqueous solution containing from 1 to 80 weight percent sodium pyrophosphate peroxide $$(Na_4P_2O_7 \cdot 2H_2O_2)$$

tends to minimize surface leakage paths and improve such device parameters as breakdown voltage.

The invention will be described in greater detail in conjunction with the accompanying drawing, in which.

The invention will be described in connection with the fabrication of a surface alloyed PNP transistor.

Figure 1:
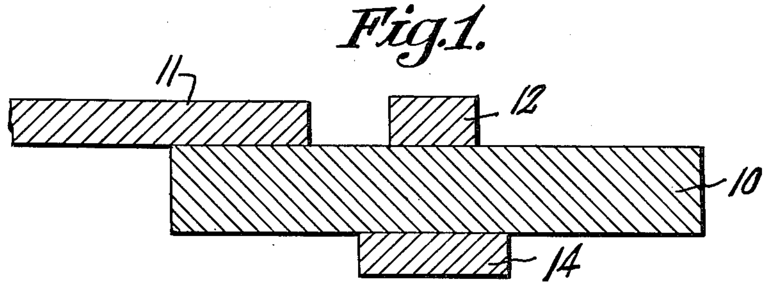
FIGURE 1 is an elevational sectional view of one step in the fabrication of a surface alloyed semiconductor device.

Referring to FIGURE 1, a thin semiconductive wafer 10 of monocrystalline N-type germanium is bonded to a metal base tab 11, which may for example consist of nickel. The exact size and shape of the wafer 10 is not critical. In this example, wafer 10 is about 100 mils square and 3 to 7 mils thick. Electrode pellets 12 and 14 are coaxially positioned on opposing major faces of wafer 10. If the semiconductive wafer 10 is N-type, as in this example, the electrodes 12 and 14 should include or consist of an acceptor material. The exact size and shape of the electrode pellets are not critical in the practice of the invention. In this example, electrode pellets 12 and 14 consist of indium discs. Advantageously, one electrode pellet is made larger than the other, since increased efficiency in collecting minority carriers is obtained when the collector electrode of a transistor is larger than the emitter electrode. In this example, electrode pellet 14 is larger than electrode pellet 12. Accordingly, in the completed device electrode 12 is preferably operated as the emitter, and electrode 14 as the collector electrode. The indium pellets 12 and 14 may be positioned and held in place by means of an appropriate jig (not shown).

The assemblage of FIGURE 1 is heated in a reducing atmosphere, such as hydrogen or forming gas, for about five minutes at 550° C. During this step the electrode pellets 12 and 14 melt and dissolve a portion of the semiconductor wafer material immediately underlying each pellet. On cooling, the dissolved semiconductor material is precipitated and recrystallized in the original crystal lattice of wafer 10. The recrystallized regions beneath pellets 12 and 14 are shown as regions 16 and 18 respectively in FIGURE 2. The recrystallized regions 16 and 18 contain sufficient indium dissolved therein to convert them to P conductivity type. Since the bulk of wafer 10 retains its original N-type conductivity, high resistivity rectifying P-N junctions 17 and 19 are formed at the interfaces between the crystallized regions 16 and 18 respectively, and the N-type bulk of wafer 10.

During the above alloying steps small amounts of the electrode material (indium in this example) tend to diffuse over the surface of wafer 10, and result in low-resistance leakage paths, which, as described above, degrade the electrical characteristics of the device.

Figure 2:
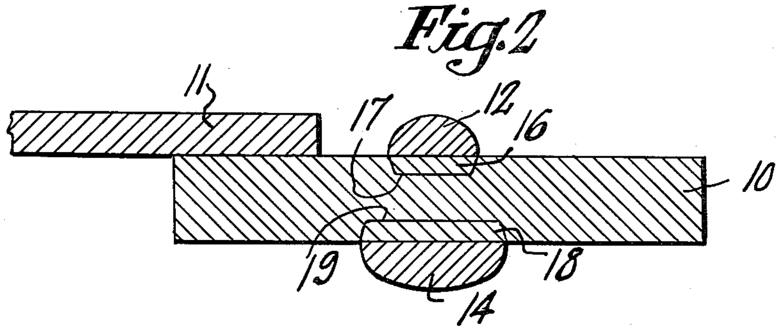
FIGURE 2 is an elevational sectional view of the assemblage in FIGURE 1 after the alloying step; and, FIGURE 3 is an elevational sectional view of the assemblage in FIGURE 2 after the etching step.
Figure 3:
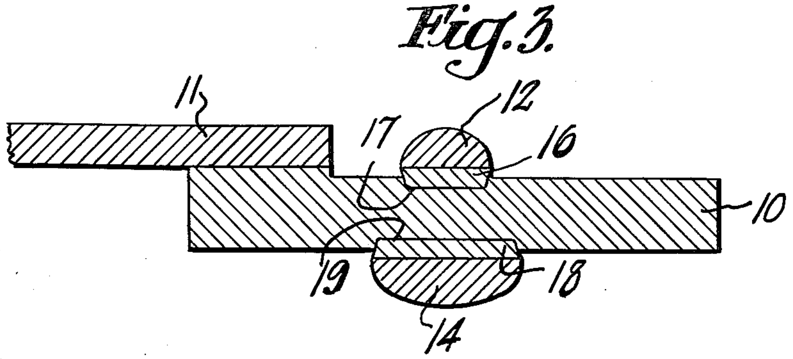

In accordance with the invention, the alloyed assemblage of FIGURE 2 is now etched by immersion in an aqueous solution containing 1 to 80 weight percent sodium pyrophosphate peroxide. The solubility of sodium pyrophosphate peroxide in water increases with increasing temperature, so that at 80° C. a saturated aqueous solution contains about 80 weight percent of the compound. The temperature of the etching solution is preferably maintained between 40° C. and 80° C. In this example, the solution is maintained at 70° C., and contains about 5 weight percent sodium pyrophosphate peroxide. Such a solution is conveniently prepared by dissolving 50 grams $Na_4P_2O_7 \cdot 2H_2O_2$ in a liter of water. The alloyed assemblage is treated in this etching bath for about 3 minutes. As in most reactions, the etching rate increases with increasing concentration or increasing temperature. It will therefore be understood that the etching time utilized is dependent on the size of the electrode pellets, the concentration of sodium pyrophosphate peroxide in the etchant, and the temperature of the etchant. Accordingly, the etching time is best determined by trial for the particular type of device, and the particular concentration and temperature of the etchant.

As a result of this treatment, a thin layer of the germanium wafer 10 is removed from the exposed wafer surfaces. At the same time, the diffused indium which spread over the surface of germanium wafer 10 is removed. For greater clarity, the thickness of the removed germanium has been exaggerated in the drawing. The device is now completed by attaching lead wires (not shown) to the electrodes 12 and 14, then encapsulating the assemblage in a protective coating, which may, for example be a silicone grease, and finally casing the device by techniques known to the art.

The above-described etching treatment has been found to minimize surface leakage paths, decrease the reverse collector current, and increase the collector breakdown voltage. Although the invention has been described in connection with a standard triode device in which both the emitter and collector junctions are of the surface alloyed type, the method of the invention has been found equally applicable to drift field transistors, in which only the collector electrode is alloyed. It has been found that when a production run of drift field transistors was treated with the sodium pyrophosphate peroxide etchant prior to encapsulation as described above, the reverse current across the collector junction was decreased, and the collector breakdown voltage was increased. Furthermore, the electrical parameters of the devices thus treated remained stable on storage.

Another advantage of the method of the invention is that the sodium pyrophosphate peroxide solution utilized is stable for relatively long periods of time. A large quantity of the solution may therefore be prepared at one time, and used as required. While so-called "stabilized" solutions of concentrated hydrogen peroxide may be prepared by various methods, it has been found that such solutions are not really stable for long periods of time. It has also been found that semiconductor devices treated with such "stabilized" hydrogen peroxide solutions of the prior art tend to exhibit variations in their electrical characteristics when stored.

Still another advantage of the method of the invention is that the sodium pyrophosphate peroxide solution utilized is less expensive than the concentrated hydrogen peroxide solutions of the prior art. A liter of 15% $H_2O_2$ costs about one dollar at present, while a liter of 5% $Na_4P_2O_7 \cdot H_2O_2$ only costs about 8 cents. The saving is substantial for a large factory making millions of semiconductor devices per year.

There have thus been described improved methods of fabricating improved semiconductive devices.

What is claimed is:

1. A method of making a semiconductor device comprising a body of semiconductive germanium including at least one P-N junction, said method comprising the step of etching said germanium body before encapsulation with an aqueous solution of 1 to 80 weight percent sodium pyrophosphate peroxide.

2. The method as in claim 1, wherein said solution contains about 5 weight percent sodium pyrophosphate peroxide.

3. The method as in claim 1, wherein said solution is maintained at a temperature of about 40° C. to 80° C.

4. A method of making a semiconductor device comprising a body of semiconductive germanium including at least one P-N junction, said method comprising the steps of etching said germanium body before encapsulation with a solution containing 50 grams $Na_4P_2O_7 \cdot 2H_2O_2$ per liter of water, said solution being maintained at a temperature of about 70° C.

5. A method of treating the surface of a semiconductive germanium wafer for use in an electrical device, comprising contacting said wafer with an aqueous solution of 1 to 80 weight percent sodium pyrophosphate peroxide.

6. The method as in claim 5, wherein said solution contains about 5 weight percent sodium pyrophosphate peroxide.

7. The method as in claim 5, wherein said solution is maintained at a temperature of about 40° C. to 80° C.

References Cited in the file of this patent

UNITED STATES PATENTS

| | | |
|---|---|---|
| 2,542,727 | Theuerer | Feb. 20, 1951 |
| 2,606,960 | Little | Aug. 12, 1952 |
| 2,834,659 | Mathre et al. | May 13, 1958 |
| 2,974,075 | Miller | Mar. 7, 1961 |
| 3,054,709 | Freestone et al. | Sept. 18, 1962 |